US009532460B2

(12) United States Patent
Meier et al.

(10) Patent No.: US 9,532,460 B2
(45) Date of Patent: Dec. 27, 2016

(54) TRANSMISSION CONTROL MODULE

(71) Applicant: Robert Bosch GmbH, Stuttgart (DE)

(72) Inventors: Thomas Meier, Oberriexingen (DE); Ingo Mueller-Vogt, Unterriexingen (DE)

(73) Assignee: Robert Bosch GmbH, Stuttgart (DE)

( * ) Notice: Subject to any disclaimer, the term of this patent is extended or adjusted under 35 U.S.C. 154(b) by 267 days.

(21) Appl. No.: 14/366,503

(22) PCT Filed: Oct. 30, 2012

(86) PCT No.: PCT/EP2012/071426
§ 371 (c)(1),
(2) Date: Jun. 18, 2014

(87) PCT Pub. No.: WO2013/091962
PCT Pub. Date: Jun. 27, 2013

(65) Prior Publication Data
US 2014/0362535 A1 Dec. 11, 2014

(30) Foreign Application Priority Data

Dec. 19, 2011 (DE) .................... 10 2011 088 969

(51) Int. Cl.
*H05H 1/14* (2006.01)
*H05K 1/18* (2006.01)
(Continued)

(52) U.S. Cl.
CPC .......... *H05K 1/185* (2013.01); *H01L 23/3121* (2013.01); *H01L 23/367* (2013.01); (Continued)

(58) Field of Classification Search
CPC .............. F16H 57/0413; F16H 61/0021; F16H 57/0408; H01L 2224/48091; H01L 2224/48472; H01L 2924/00; H01L 2924/00014; H02K 9/19; H02K 5/20; H02K 9/12; H05K 5/0082; H05K 7/20854; H05K 1/142; H05K 3/284; H05K 7/20927
(Continued)

(56) References Cited

U.S. PATENT DOCUMENTS 5,905,299 A * 5/1999 Lacap ................. H01L 23/3107
257/666
6,117,709 A * 9/2000 Hirose ................ H01L 23/4334
257/E23.043
(Continued)

FOREIGN PATENT DOCUMENTS

CN 1179009 A 4/1998
CN 1691088 A 11/2005
(Continued)

OTHER PUBLICATIONS

International Search Report corresponding to PCT Application No. PCT/EP2012/071426, mailed Feb. 4, 2013 (German and English language document) (5 pages).

*Primary Examiner* — Adam B Dravininkas
(74) *Attorney, Agent, or Firm* — Maginot, Moore & Beck LLP

(57) ABSTRACT

A transmission control module includes a printed circuit board. The circuit board has conductor tracks routed on at least one layer of the circuit board and configured to electrically connect a carrier substrate to electrical components. The circuit board has an inner conductor track layer arranged between two insulating layers. A first outer insulating layer, at least on a first side of the circuit board, has a recess. Surfaces of conductor track sections of conductor tracks of the at least one inner conductor track layer are arranged at the bottom of the recess. The carrier substrate is inserted into the recess and makes electrical contact with the (Continued)

surfaces of the conductor track sections. The recess is filled with a moulding compound which covers at least the carrier substrate and the conductor track sections to protect the carrier substrate and the conductor track sections from transmission fluid.

9 Claims, 4 Drawing Sheets

(51) Int. Cl.
*H01L 23/31* (2006.01)
*H05K 1/14* (2006.01)
*H01L 23/367* (2006.01)
*H01L 23/495* (2006.01)
*H01L 23/498* (2006.01)
*H05K 1/02* (2006.01)
*H05K 3/28* (2006.01)
*H01L 23/00* (2006.01)

(52) U.S. Cl.
CPC ...... *H01L 23/3677* (2013.01); *H01L 23/4985* (2013.01); *H01L 23/49572* (2013.01); *H05K 1/0207* (2013.01); *H05K 1/0298* (2013.01); *H05K 1/141* (2013.01); *H05K 1/144* (2013.01); *H01L 24/73* (2013.01); *H01L 2224/32225* (2013.01); *H01L 2224/48227* (2013.01); *H01L 2224/73265* (2013.01); *H01L 2924/19107* (2013.01); *H05K 1/181* (2013.01); *H05K 1/183* (2013.01); *H05K 3/284* (2013.01)

(58) Field of Classification Search
USPC .................................... 361/5, 706, 717, 720
See application file for complete search history.

(56) References Cited

U.S. PATENT DOCUMENTS

| | | | |
|---|---|---|---|
| 6,252,010 B1* | 6/2001 | Takeuchi | B32B 15/08 257/E21.505 |
| 2004/0055783 A1* | 3/2004 | Masuda | H01L 23/3107 174/252 |
| 2004/0212965 A1* | 10/2004 | Ishii | H01L 23/49531 361/709 |
| 2005/0230818 A1* | 10/2005 | Ohno | H01L 23/36 257/707 |
| 2006/0281230 A1* | 12/2006 | Brandenburg | H01L 23/3121 438/127 |
| 2009/0126967 A1 | 5/2009 | Spellman | |
| 2010/0097775 A1 | 4/2010 | Kashiwazaki et al. | |
| 2010/0149763 A1* | 6/2010 | Wetzel | H05K 5/0082 361/749 |
| 2011/0007478 A1* | 1/2011 | Takahashi | H01L 23/3121 361/721 |

FOREIGN PATENT DOCUMENTS

| | | |
|---|---|---|
| DE | 197 50 306 A1 | 5/1999 |
| DE | 10 2004 011 808 A1 | 9/2005 |
| DE | 10 2007 029 913 A1 | 1/2009 |
| EP | 1 396 885 A1 | 3/2004 |
| WO | 2009/065105 A2 | 5/2009 |

* cited by examiner

TRANSMISSION CONTROL MODULE

This application is a 35 U.S.C. §371 National Stage Application of PCT/EP2012/071426, filed on Oct. 30, 2012, which claims the benefit of priority to Serial No. DE 10 2011 088 969.8, filed on Dec. 19, 2011 in Germany, the disclosures of which are incorporated herein by reference in their entirety.

BACKGROUND

The disclosure relates to a transmission control module with the features of the description below.

In transmission control, there are known transmission control modules that have in addition to an electronic transmission control device a base carrier intended for making electrical contact with actuators, sensors, connector parts or actuating motors. It is known to use a printed circuit board as the base carrier of the electrical connection components. In this case, the electrical connections are preferably routed by way of inner layers of the printed circuit board. As a difference from classic control devices, which arrange a printed circuit board with an electronic control circuit arranged thereon within a closed metal housing, these transmission control modules use a conventional printed circuit board as the base carrier of the module, even outside the area protected by a housing. Such modules can be produced at particularly low cost because of the use of the inexpensive and well-mastered circuit board technology. Such a transmission control module is known for example from the generically determinative DE 10 2007 029 913 A1. In the known document, electronic components of a transmission control circuit are loaded directly on the printed circuit board and covered with a housing part arranged over the components. Since transmission control modules are installed in the transmission and are exposed there to the transmission fluid, the regions of the printed circuit board that are not covered by housing parts are exposed to the aggressive transmission fluid. The use of conventional printed circuit boards as carriers of the electrical connection components in the transmission fluid requires new construction and connection concepts.

Furthermore, control devices in which a lead frame provided with an electronic control circuit is completely embedded in a housing of molding compound are known for example from US 2010/0097775 A1. Electrical terminals formed as flat conductor strips that make contact with the lead frame in the interior of the molding compound and with their other ends are led out from the molding compound are provided for the connection of the control device. However, without having a base carrier for the connection components connected to them, such control devices cannot be used for activating actuators, sensors, connector parts or servomotors of a transmission control. The arrangement and contact-making of the control device with the base carrier is problematic because special measures are necessary to protect the electrical contact points between the control device and the base carrier from the transmission fluid and metallic swarf contained therein.

SUMMARY

The transmission control module according to the disclosure makes it possible to integrate a transmission control circuit in a manner that is simple, particularly compact and sealed with respect to transmission fluid in a transmission control module on the basis of a printed circuit board for establishing the electrical connections between the transmission control circuit and the various components to be activated of the module. As a difference from DE 10 2007 029 913 A1, the transmission control circuit is produced on a carrier substrate that is separate from the printed circuit board. A ceramic LTCC substrate (Low Temperature Cofired Ceramics) or a micro printed circuit board or some other suitable carrier substrate that at least on a loading side is loaded with electrical/electronic components of the transmission control circuit may be used for example as the carrier substrate. The carrier substrate may have conductor tracks that connect the components of the carrier substrate to one another. In particular, such conductor tracks may also be provided on multiple layers of the carrier substrate, it even being possible for inner layers of the carrier substrate to have conductor tracks. The production of the transmission control circuit on a carrier substrate, such as for example an LTCC or a micro printed circuit board, is a technique that has been reliably mastered in the prior art, so that it is advantageously possible here to rely on successfully proven methods.

The disclosure is based on the idea that the printed circuit board of the module that forms the base carrier has conductor tracks for establishing the electrical connection between the circuit and the module components, such as for example actuators, connectors and sensors, on at least one protected inner conductor track layer. Instead of connecting these conductor tracks to the outer side of the printed circuit board by way of plated-through holes, at least on an outer first side of the printed circuit board the outer insulating layer located there is advantageously provided with a recess, on the base of which at least surfaces of conductor track portions of conductor tracks of the at least one inner conductor track layer are arranged. This can, for example, take place in a simple way by a recess with for example rectangular dimensions being in particular milled into the outer insulating layer of the printed circuit board, milling-through proceeding as far as the conductor tracks of the inner conductor track layer. The recess may also be introduced in some other suitable way, it being possible for suitable material-removing processing methods to be used or for the recess to be already provided in the printed circuit board during its production process. The carrier substrate with the circuit arranged thereon is inserted into the recess from the first side of the printed circuit board and brought into electrical contact with the surfaces of the exposed conductor track portions of the inner conductor track layer, for which various contact-making techniques can be used, as still to be explained. The arrangement of the carrier substrate in the recess allows the total thickness of the printed circuit board to be advantageously reduced in comparison with the arrangement of the carrier substrate on the outer side of the printed circuit board.

In order to protect the electronic transmission control circuit applied to the carrier substrate and the exposed conductor track portions of the inner conductor track layer from the aggressive transmission fluid (ATF, automatic transmission fluid), the recess is filled with a molding compound, covering at least the carrier substrate and the conductor track portions. A molding compound is understood as meaning an encapsulating compound that keeps out media, is filled into the recess and cured, and thereby forms a solid covering that is sealed with respect to transmission fluid, provides protection from mechanical effects and is securely integrated in the printed circuit board. A thermoset is preferably used as the molding compound. The molding compound may in particular be chosen such that it comprises for example an epoxy resin compound (molding resin). A molding process and/or compression molding process may be used for example for applying the molding compound, in particular in conjunction with an epoxy resin compound, transfer molding processes being used particularly preferably. A transfer molding process should be understood here as meaning a process in which the molding compound, for example an epoxy resin compound and/or a precursor of the same, is preheated and loaded into a chamber. From there, the flowable material is brought out of the chamber by means of a plunger through channels into cavities of a mold. The walls of these cavities are usually heated to above the melting point of the encapsulating material. In the case of the transfer molding process, thermosets, such as for example epoxy resin compounds, may be used. Curing may take place directly in the mold or for example also later. The molding compound reliably seals off the carrier substrate located in the recess. After the filling of the molding compound into the recess, the cured molding compound is advantageously also supported on the inner wall of the recess, whereby shearing forces that could result in a detachment of the molding compound are advantageously reduced and the molding compound is securely connected to the printed circuit board. The molding compound has a high bonding strength on the first side of the printed circuit board, so that penetration of transmission fluid into gaps between the molding compound and the printed circuit board is reliably prevented. However, the molding compound also advantageously serves for the additional mechanical fastening of the carrier substrate to the printed circuit board, the carrier substrate being connected to the printed circuit board in a particularly reliable and compact way by the molding compound.

Advantageous forms and further developments of the disclosure are made possible by the measures specified in the description below.

The fact that the molding compound fills the recess completely and, on the first side of the printed circuit board, covers an outer peripheral surface of the printed circuit board surrounding the recess advantageously creates an enlarged sealing region in which the molding compound is securely bonded to the first side of the printed circuit board. The probability of transmission fluid penetrating into gaps between the molding compound and the printed circuit board is thereby advantageously reduced still further.

The carrier substrate can be advantageously brought into electrical contact with the surfaces of the conductor track portions of the conductor tracks by way of bonding wires. In this case, the carrier substrate is for example arranged on the base of the recess between the ends of conductor track portions of conductor tracks of the inner conductor track layer and for example adhesively bonded onto the insulating layer located on the base of the recess. The establishment of the bonding connection between the carrier substrate and the conductor track portions that are accessible in the recess can be carried out without any problem. The molding compound with which the recess is filled also surrounds the bonding wires and, as a result, reliably protects the electrical connection between the carrier substrate and the printed circuit board.

However, it is also possible to bring the carrier substrate into electrical contact with the surfaces of the conductor track portions of the conductor tracks on its rear side, facing away from the first side of the printed circuit board, by means of contact elements. In this case, the carrier substrate has contact elements on the rear side, inserted into the recess, for example in the form of solder contacts or conductive adhesive connections, which make contact with the conductor track portions directly. In this exemplary embodiment, the size of the recess can be advantageously reduced, since the carrier substrate is arranged on the base of the recess directly above the conductor track portions and no lateral space need be provided for the attachment of bonding wires.

In a particularly advantageous exemplary embodiment, it is provided that, on the second side of the printed circuit board, facing away from the first side of the printed circuit board, a second outer insulating layer is provided with a second recess, which is taken through to a rear side of the carrier substrate that is facing away from the first side of the printed circuit board and is loaded with components, and that the second recess on the second side of the printed circuit board is filled with a molding compound covering the rear side of the carrier substrate and the rear side of the carrier substrate is consequently protected from transmission fluid by the molding compound. In the case of this exemplary embodiment, the carrier substrate of the electronic transmission control circuit may advantageously be loaded on both sides with electrical/electronic components, which may protrude into the second recess of the printed circuit board. As a result, higher densities of loading with electrical/electronic components can be achieved on the carrier substrate without increasing the lateral dimensions of the same.

Also advantageous is an exemplary embodiment in which the carrier substrate is additionally applied in a heat-conducting manner to a large-area conductor track of the inner conductor track layer within the recess. The large-area conductor track laterally dissipates the heat generated during operation by the transmission control circuit located on the carrier substrate and for this purpose extends on at least one side beyond the lateral extent of the carrier substrate. Since heat which in the case of the transmission control module according to the disclosure is dissipated by way of the printed circuit board is generated during the operation of the electronic control circuit, it is of advantage if the carrier substrate dissipates the heat by way of the rear side to the large-area conductor track. Since the conductor tracks of the printed circuit board are metallic (preferably the copper conductor tracks that are customary in circuit board technology), the large-area conductor track represents an efficient possible way of dissipating the heat generated by the carrier substrate in the direction of the side regions of the printed circuit board. The large-area conductor track may advantageously extend as far as a conductor track portion that is connected in a heat-conducting manner to conductor tracks serving as cooling surfaces on the first side and/or the second side of the printed circuit board. The cooling surfaces may for example be advantageously connected in a heat-conducting manner to heat sinks, so that the heat generated during the operation of the transmission control module can be dissipated by way of the large-area conductor track, the cooling surfaces and the heat sinks.

In a further advantageous exemplary embodiment of the disclosure, the printed circuit board has at least two inner conductor track layers, which are kept at a distance from one another by way of at least one inner insulating layer. The carrier substrate is advantageously electrically connected to surfaces of conductor track portions of the first inner conductor track layer by way of bonding wires and, on its rear side facing away from the first side of the printed circuit board, by means of contact elements to surfaces of conductor track portions of conductor tracks of the second inner conductor track layer. Since the electrical connections of the carrier substrate to the printed circuit board are made by way of at least two inner conductor track layers, a relatively large number of contact points of the carrier substrate can be electrically connected to the printed circuit board in a simple way.

BRIEF DESCRIPTION OF THE DRAWINGS

Exemplary embodiments of the disclosure are explained in more detail in the description that follows and are represented in the drawings, in which.

DETAILED DESCRIPTION

Figure 1:
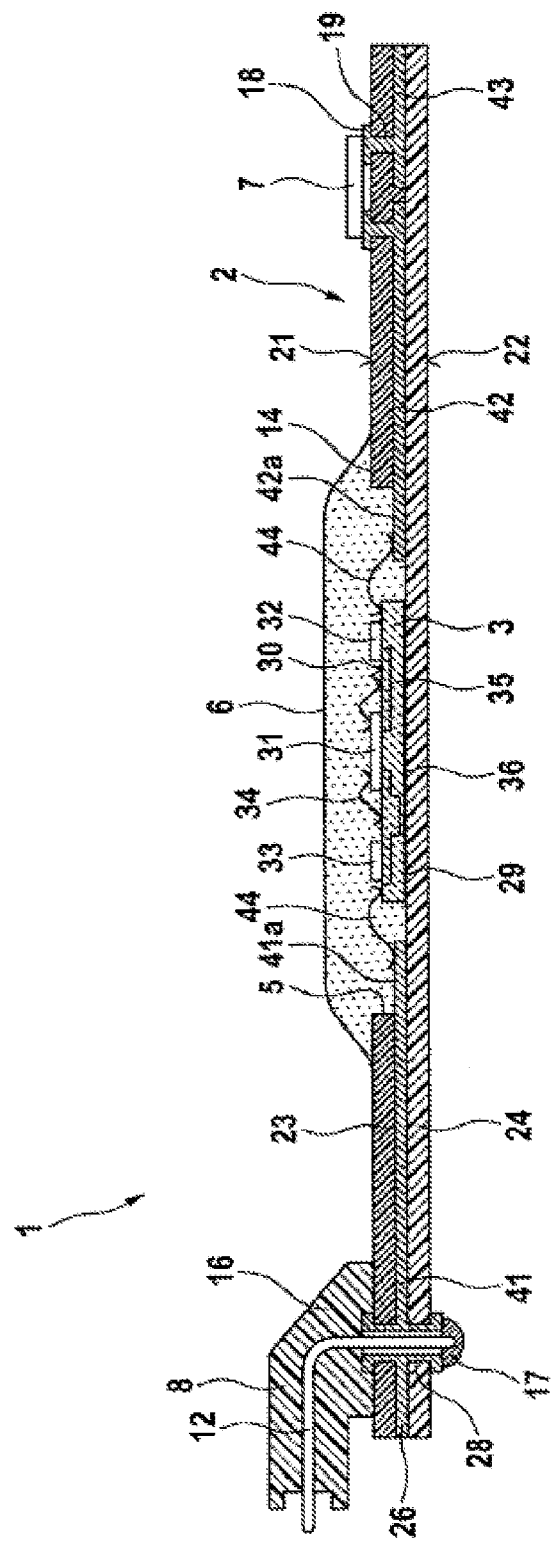
FIG. 1 shows a cross section through a first exemplary embodiment of the disclosure.

FIG. 1 shows a cross section through a first exemplary embodiment of a transmission control module 1 according to the disclosure, which may for example be installed in the automatic transmission of a motor vehicle. In principle, parts that are the same or very similar are provided with the same reference signs.

The transmission control module is intended to be at least partially or completely exposed to the transmission fluid (ATF) present in the transmission, and serves for activating adjusters and for reading sensors for the actuation of an automatic transmission. It goes without saying that the transmission control module may be adapted to the respectively required boundary conditions, such as the number and type of actuators, sensors and plug-in connections to be activated. The transmission control module may have a main body (not represented in the figures), which may for example be formed by a complex plastic part or a metallic carrier plate, to which a printed circuit board has been applied. It is possible to dispense with the main body if the printed circuit board assumes its mechanical fastening function and all of the components of the control module are fastened directly to the printed circuit board. The printed circuit board 2 is for example a conventional printed circuit board of glass-fiber reinforced epoxy resin or similar material. Printed circuit boards of FR4 or higher-grade circuit board substrates come into consideration for example. Conductor tracks of the printed circuit board 2 preferably consist of copper, as is customary in circuit board technology. However, other electrically conductive or metallic materials may also be used. Printed circuit boards of one or more layers, known as multilayer printed circuit boards, may be used in particular.

The printed circuit board 2 has a first side 21 and a second side 22, facing away from the first side 21. In the case of the exemplary embodiment of FIG. 1, the printed circuit board 2 also has at least one inner conductor track layer 26, in which individual conductor tracks are routed. In FIG. 1, three conductor tracks 41, 42, 43 of the inner conductor track layer 26 can be seen by way of example. The inner conductor track layer 26 is embedded in the printed circuit board between a first insulating layer 23 and a second insulating layer 24, in the case of the exemplary embodiment that is represented in FIG. 1 the first insulating layer 23 and the second insulating layer 24 at the same time forming outer regions of the printed circuit board 2. The printed circuit board 2 serves for making contact with actuators, for example electrohydraulic pressure control valves, sensors and connectors or other components with an electronic transmission control circuit.

In FIG. 1, a connector part 8, which has been loaded onto the printed circuit board 2, is represented as an example of a component connected to the printed circuit board. The connector part 8 has contact elements 12, which are arranged in a connector housing 16 of plastic. The plastic housing 16 has for example been introduced with the contact element 12 into a metallized plated-through hole 28 of the printed circuit board 2 and electrically connected to the plated-through hole 28, for example by means of solder 17. An electrical connection to a conductor track 41 of the inner conductor track layer 26 is represented by way of the plated-through hole 28. The connector part 8 is therefore mechanically and electrically connected to the printed circuit board 2. Contact-making techniques for components on printed circuit boards are sufficiently well known, so that there is no need at this point to go into this in any more detail. Further components may be arranged on the outer sides of the printed circuit board 2, for example the component 7 represented in FIG. 1, which has been applied to terminal areas 18 on the first side 21 of the printed circuit board and has been electrically connected to the terminal areas 18. The terminal areas 18 have been brought into contact with conductor tracks 42 and 43 of the inner conductor track layer 26 by way of electrical interconnections (VIAS) of the printed circuit board 2. If required, the component 7 may for example be protected from transmission fluid by a protective covering or a protective coating. The component 7 may for example be a sensor, for example a temperature sensor or a pressure sensor or a speed sensor. Not represented in FIG. 1 are further terminals on the printed circuit board 2 for actuators, such as for example electro-hydraulic pressure control valves for controlling transmission switching operations or for servomotors of oil pumps and other electrical components.

As can be seen in FIG. 1, the first outer insulating layer 23 on the first side 21 of the printed circuit board 2 is provided with a recess 5, which is for example rectangular. The recess 5 has been introduced into the printed circuit board 2 at least to such a depth that on its base conductor track portions 41a, 42a of the conductor tracks 42, 43 of the inner conductor track layer 26 are exposed. The introduction of the recess 5 into the printed circuit board 2 may preferably take place by a milling operation, in which milling proceeds from the first side 21 of the printed circuit board as far as the inner conductor track layer 26, so that at least the surfaces of the conductor portions 41a, 42a are exposed.

The transmission control module also comprises a carrier substrate 3, which is loaded with electrical/electronic components 31, 32, 33 forming a transmission control circuit. The carrier substrate 3 may be a ceramic hybrid substrate, in particular an LTCC substrate, or for example a micro printed circuit board or a similar small carrier substrate. The carrier substrate has an upper side 30, provided as the loading side for applying the components 31, 32, 33, and a rear side 29, facing away from said upper side. As represented in FIG. 1, the preferably rectangular and plate-like carrier substrate 3 may for example have bonding wire connections 34 or conductor track connections (not represented) on the upper side 30 and/or inner conductor tracks 35 for the wiring of the components 31, 32, 33.

The dimensions of the recess 5 have been set such that the carrier substrate 3 can be inserted with the rear side 29 into the recess 5. In the case of the exemplary embodiment represented in FIG. 1, the carrier substrate 3 may thereby be adhesively bonded on the rear side 29, for example by way of an adhesive 36, onto the side of the lower outer insulating layer 24 that is facing the recess 5. The carrier substrate may, however, also be mechanically fastened in the recess in some other way, or it may be envisaged to ensure the mechanical fastening by the molding compound 6 that is subsequently filled into the recess. In the case of the exemplary embodiment from FIG. 1, the carrier substrate 3 has not been placed onto the conductor track portions 41a, 42a, but instead is kept at a distance from the free ends of the conductor track portions 41a, 42a of the inner conductor tracks 41, 42. As explained later on the basis of the exemplary embodiment of FIG. 2, this may however also be done differently. In the case of the exemplary embodiment shown here, bonding wires 44 are provided for the electrical connection of the carrier substrate 3 to the conductor track portions 41a, 42a. In the known bonding technique, the carrier substrate 3 arranged in the recess 5 is brought into electrical contact with the surfaces of the conductor track portions 41a, 42a by way of bonding wires 44, only two of which can be seen in FIG. 1. In this case, bonding takes place onto the surfaces of the conductor track portions that run parallel to the direction of extent of the conductor tracks. Such bonding connections can be reliably established in a simple way.

In the production of the transmission control module, after the introduction of the carrier substrate 3 and the establishment of the bonding connections, the molding compound 6 is filled into the recess 5. The molding compound 6 completely covers the carrier substrate 3 and the conductor track portions 41a, 42a. As can be seen in FIG. 1, the molding compound 6 fills the recess 5 completely and protrudes from the first side 21 of the printed circuit board in a hump-like manner, an outer peripheral surface 14 of the printed circuit board that surrounds the recess 5 preferably also being covered on the first side 21 of the printed circuit board 2. As already described, a thermoset, preferably an epoxy resin (molding resin) that has been filled into the recess and cured is preferably used as the molding compound, and thereby forms a solid covering that is sealed with respect to transmission fluid and provides protection from mechanical effects. The application of the molding compound may preferably be performed by a transfer molding process, in which the molding compound, for example the epoxy resin compound, is preheated and loaded into a chamber. From there, the flowable material is brought out of the chamber by means of a plunger through channels into cavities of a mold. The walls of these cavities are usually heated to above the melting point of the molding compound. After the curing, the molding compound 6 reliably seals off the carrier substrate 3 located in the recess 5.

Figure 2:
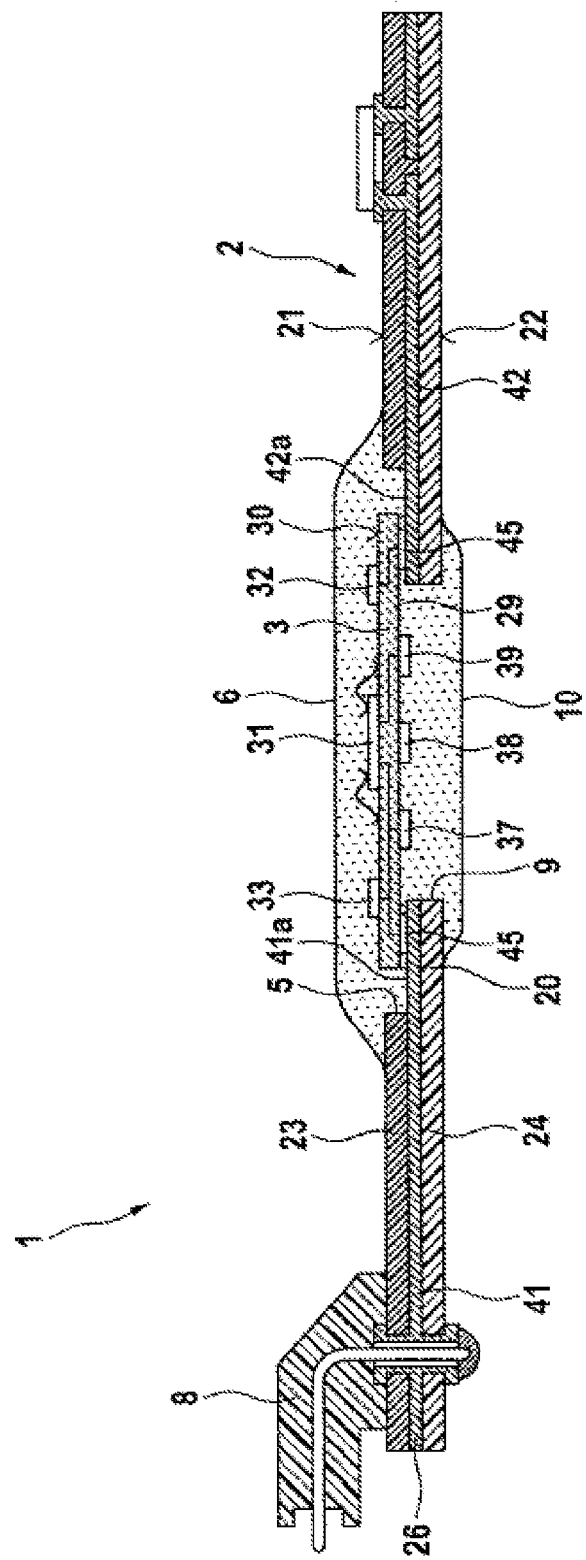
FIG. 2 shows a cross section through a second exemplary embodiment of the disclosure, with the printed circuit board being filled with molding compound on both sides.

A second exemplary embodiment of the disclosure is represented in FIG. 2. The exemplary embodiment represented in FIG. 2 differs from the exemplary embodiment represented in FIG. 1 in two features. As can be seen in FIG. 2, the carrier substrate 3 is not only provided with components 31, 32, 33 on the upper side 30, but is also provided with further components 37, 38, 39 on the rear side 29, facing away from said upper side. In order that the components 37, 38, 39 arranged on the rear side 29 do not touch the base of the recess 5, the printed circuit board 2 is provided on the second side 22, facing away from the first side 21, with a further recess 9, which has been introduced into the second outer insulating layer 24 and has been taken through as far as the first recess 5. Consequently, the first recess 5 and the second recess 9 form a through-passage. However, the dimensions of the second recess 9 are made to be somewhat smaller than the dimensions of the first recess 5, so that the second outer insulating layer 24 forms in the through-passage an inwardly projecting frame 20. The carrier substrate 3 has been placed with the rear side 29 onto this frame 20, so that the components 37 to 39 on the rear side of the carrier substrate 3 can engage in the second recess 9. Although in the case of this exemplary embodiment too contact-making of the carrier substrate 3 with the conductor tracks 41, 42 could take place by way of bonding wires, as a departure from the exemplary embodiment in FIG. 1 it is preferably envisaged to bring the carrier substrate 3 into contact with the surfaces of the conductor track portions 41a, 42a on the rear side 29 by way of contact elements 45. These contact elements 45 may for example be formed by conductive adhesive connections or solder contacts, which are connected in an electrically conducting manner on the rear side 29 of the carrier substrate to contact areas that are present there.

It goes without saying that the electrical contact-making of the carrier substrate 3 with the conductor track portions 41a, 42a that is represented in FIG. 2, by means of contact elements 45 arranged on the rear side 29 of the carrier substrate 3, can be performed independently of whether a second recess 9 is provided in the printed circuit board 3. Conversely, the provision of the second recess 9 in combination with the loading with components of the rear side 29 of the carrier substrate 2 can be undertaken independently of the contact elements 45, as already explained above.

Figure 3:
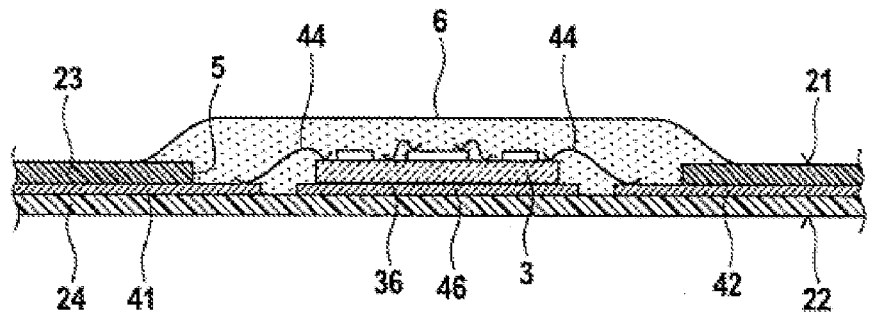
FIG. 3 shows a detail of a third exemplary embodiment of the disclosure.
Figure 4:
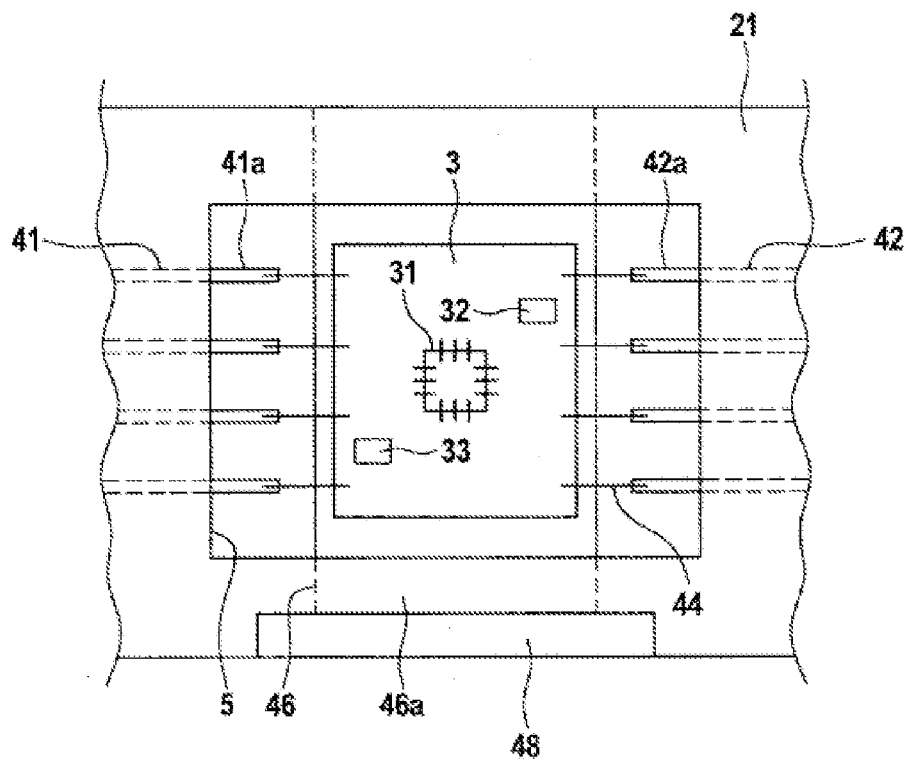
FIG. 4 shows a plan view of the third exemplary embodiment from FIG. 3, without the molding compound.

A third advantageous exemplary embodiment is represented in FIG. 3 and FIG. 4. This exemplary embodiment is based on the exemplary embodiment explained in FIG. 1, but additionally uses a large-area conductor track 46 under the carrier substrate 3. In this exemplary embodiment, the carrier substrate 3 has been applied with the rear side 29 to a large-area conductor track 46 on the base of the recess 5 by way of a heat-conducting connection, for example a heat-conducting adhesive 36. On at least one side, the large-area conductor track 46 extends beyond the lateral dimensions of the carrier substrate 3. In the exemplary embodiment, the large-area conductor track 46 protrudes beyond the carrier substrate on all sides and has in particular at least one conductor track portion 46a that extends up to the periphery of the printed circuit board 2 and is connected there in a heat-conducting manner, for example by way of interconnectors (VIAS) 49, to conductor tracks 47, 48, serving as cooling areas, on the first side 21 and/or the second side 22 of the printed circuit board 2.

Figure 5:
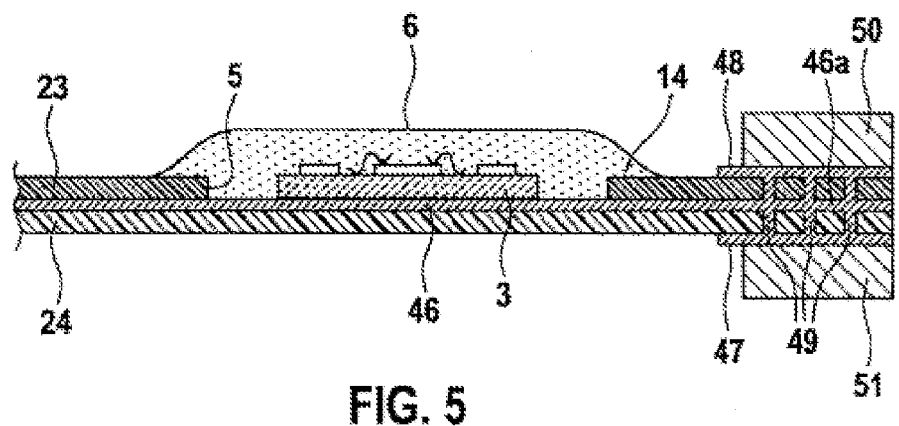
FIG. 5 shows a cross section through a fourth exemplary embodiment, similar to the third exemplary embodiment, in a plane perpendicular to the plane of the representation from FIGS. 3 and 4.

As represented in FIG. 5, which shows a section through the printed circuit board perpendicularly to the plane of FIG. 4 and perpendicularly to the section in FIG. 3, in a fourth exemplary embodiment the conductor tracks 47, 48 serving as cooling areas on the first side 21 and/or the second side 22 of the printed circuit board can be brought into contact with heat sinks 50, 51, preferably with metallic heat sinks. During operation, the heat generated by the components of the carrier substrate 3 flows by way of the heat-conducting adhesive 36 onto the large-area conductor track 46 and from there laterally away to the conductor track portion 46a, from where the heat is dissipated by way of the interconnectors 49 to the cooling areas 47, 48 and the heat sinks 50, 51. It goes without saying that there are further possible ways of taking up the heat through the large-area conductor track 46 on the underside of the carrier substrate and dissipating it laterally. For example, it is possible to dissipate the heat laterally in four directions.

Figure 6:
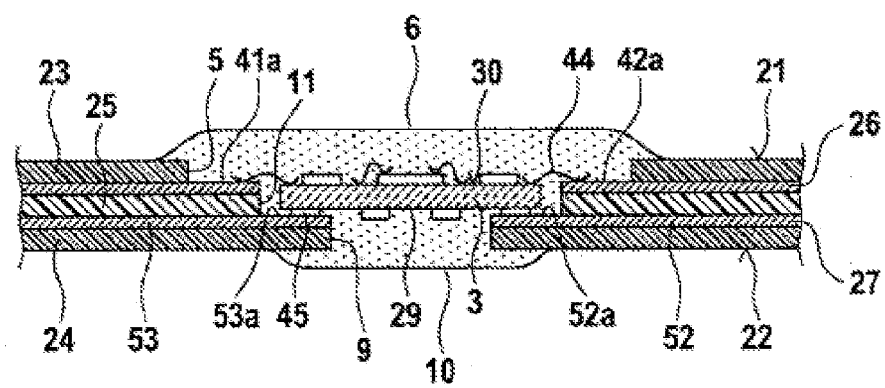
FIG. 6 shows a detail of a fifth exemplary embodiment of the disclosure.

A further exemplary embodiment is represented in a partial view in FIG. 6. In the case of this exemplary embodiment, the printed circuit board 2 has not just one inner conductor track layer, but two inner conductor track layers 26, 27. The first inner conductor track layer 26 and the second inner conductor track layer 27 are separated from one another by way of at least one inner insulating layer 25. On the outer sides, the printed circuit board 2 has a first outer insulating layer 23, covering the first inner conductor track layer 26, and a second outer insulating layer 24, covering the second inner conductor track layer 27. On the first side 21 of the printed circuit board 2, the first outer insulating layer 23 is provided with a first recess 5, which is adjoined by a further recess 11, introduced into the inner insulating layer 25, with smaller lateral dimensions than the dimensions of the first recess 5. In the case of the exemplary embodiment in FIG. 6, the further recess 11 may be regarded as a third recess, as still to be explained below. The carrier substrate 3 has been inserted from the first side 21 of the printed circuit board 2 into the first recess 5 of the outer insulating layer 23 and the further recess 11 of the inner insulating layer 25 and electrically connected to surfaces of conductor track portions 41a, 42a of the first inner conductor track layer 26 by way of bonding wires 44 and on its rear side 29, facing away from the first side 21 of the printed circuit board 2, to surfaces of conductor track portions 52a, 53a of conductor tracks 52, 53 of the second inner conductor track layer 27 by means of contact elements 45. Optionally, in a way similar to the exemplary embodiment from FIG. 2, the carrier substrate may be provided with components on both sides and a second recess 9, which leads to the rear side 29 of the carrier substrate 3, may be provided on the second side 22 of the printed circuit board. As in the case of the exemplary embodiment of FIG. 2, the second recess 9 is filled with a further molding compound 10.

It goes without saying that it is also possible to dispense with the second recess 9, and for only the first recess 5 and a further recess 11 of the inner insulating layer 11 to be provided, if for example the carrier substrate 3 is only loaded with components on the upper side 30.

Furthermore, it is also possible for more than two inner conductor track layers to be provided. Generally, the disclosure may be used in the case of multilayer printed circuit boards with two, three, four or more inner conductor track layers.

The exemplary embodiments represented serve only for explaining the disclosure and do not represent any restriction of the disclosure to the embodiments actually represented in each case. In particular, combinations of the exemplary embodiments of the disclosure that are readily apparent to a person skilled in the art from the embodiments represented are included. Thus, for example, the contact-making of the rear side of the carrier substrate that is represented in FIG. 2 may also be used in the case of the exemplary embodiment of FIG. 1, or the large-area conductor track that is represented in FIG. 4 may be used in combination with a multilayer printed circuit board with more than one inner conductor track layer.

The invention claimed is:

1. A transmission control module, comprising:
a printed circuit board at least partially accessible from outside, the printed circuit board configured to be exposed to transmission fluid and including conductor tracks routed on at least one layer of the printed circuit board and configured to electrically connect a carrier substrate of an electronic transmission control circuit to electrical/electronic components arranged outside the carrier substrate on the printed circuit board, the printed circuit board having at least one inner conductor track layer arranged as an intermediate layer between two insulating layers of the printed circuit board, wherein:
the printed circuit board has a first side and a second side facing opposite the first side, the first side of the printed circuit board has a first outer insulating layer including a first recess, and the second side of the printed circuit board has a second outer insulating layer including a second recess,
the second recess is taken through to a rear side of the carrier substrate, the rear side of the carrier substrate faces away from the first side of the printed circuit board and is loaded with components,
surfaces of conductor track portions of conductor tracks of the at least one inner conductor track layer are arranged on a base of the first recess,
the carrier substrate is configured to be inserted into the first recess from the first side of the printed circuit board and brought into electrical contact with the surfaces of the conductor track portions of the inner conductor track layer, and
the first recess is filled with a molding compound to cover at least the carrier substrate and the conductor track portions to protect the carrier substrate and the conductor track portions from transmission fluid, and the second recess is filled with the molding compound covering the rear side of the carrier substrate to protect the rear side of the carrier substrate from transmission fluid.

2. The transmission control module as claimed in claim 1, wherein the first recess is filled completely with the molding compound and, on the first side of the printed circuit board, an outer peripheral surface of the printed circuit board surrounding the recess is covered by the molding compound.

3. The transmission control module as claimed in claim 1, wherein the carrier substrate is brought into electrical contact with the surfaces of the conductor track portions of the conductor tracks by bonding wires.

4. The transmission control module as claimed in claim 1, wherein the carrier substrate is brought into electrical contact with the surfaces of the conductor track portions of the conductor tracks on the rear side by contact elements.

5. The transmission control module as claimed in claim 4, wherein the contact elements are formed by one of conductive adhesive and solder contacts.

6. A transmission control module, comprising:
a printed circuit board at least partially accessible from outside, the printed circuit board configured to be exposed to transmission fluid and including conductor tracks routed on at least one layer of the printed circuit board and configured to electrically connect a carrier substrate of an electronic transmission control circuit to electrical/electronic components arranged outside the carrier substrate on the printed circuit board, the printed circuit board having at least one inner conductor track layer arranged as an intermediate layer between two insulating layers of the printed circuit board, wherein:
a first side of the printed circuit board has a first outer insulating layer including a recess,
surfaces of conductor track portions of conductor tracks of the at least one inner conductor track layer are arranged on a base of the recess, the carrier substrate is configured to be inserted into the recess from the first side of the printed circuit board and brought into electrical contact with the surfaces of the conductor track portions of the inner conductor track layer, the recess is filled with a molding compound to cover at least the carrier substrate and the conductor track portions to protect the carrier substrate and the conductor track portions from transmission fluid, the carrier substrate is applied in a heat-conducting manner to a large-area conductor track of the inner conductor track layer within the recess, the large-area conductor track is configured to laterally dissipate heat generated during operation by the transmission control circuit located on the carrier substrate, and the large-area conductor track is configured to extend on at least one side beyond a lateral extent of the carrier substrate.

7. The transmission control module as claimed in claim 6, wherein:

on at least one side of the carrier substrate, the large-area conductor track extends beyond lateral dimensions of the carrier substrate up to a conductor track portion, the conductor track portion is connected in a heat-conducting manner to conductor tracks configured to serve as cooling areas, on at least one of the first side and a second side of the printed circuit board.

8. The transmission control module as claimed in claim 7, wherein the conductor tracks configured to serve as cooling areas on at least one of the first side and the second side of the printed circuit board are connected in a heat-conducting manner to a heat sink.

9. A transmission control module, comprising:

a printed circuit board at least partially accessible from outside, the printed circuit board configured to be exposed to transmission fluid and including conductor tracks routed on at least one layer of the printed circuit board and configured to electrically connect a carrier substrate of an electronic transmission control circuit to electrical/electronic components arranged outside the carrier substrate on the printed circuit board, the printed circuit board having at least one inner conductor track layer arranged as an intermediate layer between two insulating layers of the printed circuit board, wherein:

the printed circuit board has a first inner conductor track layer and a second inner conductor track layer kept at a distance from one another by at least one inner insulating layer, the printed circuit board has a first side and a second side facing opposite the first side, the first side of the printed circuit board has a first outer insulating layer including a first recess which is adjoined by a further recess in the inner insulating layer, lateral dimensions of the further recess are smaller than dimensions of the first recess, the carrier substrate is inserted from the first side of the printed circuit board into the first recess of the first outer insulating layer and the further recess of the inner insulating layer, the carrier substrate is electrically connected to surfaces of conductor track portions of the first inner conductor track layer by bonding wires, a rear side of the carrier substrate, which is facing away from the first side of the printed circuit board, is electrically connected to surfaces of conductor track portions of conductor tracks of the second inner conductor track layer by contact elements, and the recess is filled with a molding compound to cover at least the carrier substrate and the conductor track portions to protect the carrier substrate and the conductor track portions from transmission fluid.

* * * * *